US012610529B2

(12) United States Patent
Cao et al.

(10) Patent No.: US 12,610,529 B2
(45) Date of Patent: Apr. 21, 2026

(54) SEMICONDUCTOR STRUCTURE COMPRISING STORAGE CHIP BONDED WITH CONTROL CHIP AND METHOD FOR FORMING SAME

(71) Applicant: CHANGXIN MEMORY TECHNOLOGIES, INC., Hefei City (CN)

(72) Inventors: Kanyu Cao, Hefei (CN); Tzung-Han Lee, Hefei (CN); Chih-Cheng Liu, Hefei (CN); Huaiwei Yang, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 531 days.

(21) Appl. No.: 18/151,360

(22) Filed: Jan. 6, 2023

(65) Prior Publication Data

US 2023/0389288 A1     Nov. 30, 2023

Related U.S. Application Data

(63) Continuation of application No. PCT/CN2022/101005, filed on Jun. 24, 2022.

(30) Foreign Application Priority Data

May 31, 2022     (CN) ......................... 202210610207.5

(51) Int. Cl.
*H10B 12/00*         (2023.01)
*H10D 30/67*         (2025.01)
(52) U.S. Cl.
CPC ....... *H10B 12/315* (2023.02); *H10B 12/0335* (2023.02); *H10B 12/05* (2023.02); *H10B*

*12/482* (2023.02); *H10B 12/50* (2023.02); *H10D 30/6735* (2025.01); *H10D 30/6757* (2025.01)

(58) Field of Classification Search
CPC .. H10B 12/315; H10B 12/0335; H10B 12/05; H10B 12/482; H10B 12/50; H10D 30/6735; H10D 30/6757
USPC .......................................................... 257/295
See application file for complete search history.

(56) References Cited

U.S. PATENT DOCUMENTS 5,006,909 A * 4/1991 Kosa .................... H10B 12/395
                                                              257/305
2012/0205733 A1    8/2012 Kang
2015/0004771 A1    1/2015 Kang
                        (Continued)

FOREIGN PATENT DOCUMENTS

CN          112071841 A     12/2020
CN          112951828 A     6/2021
                        (Continued)

*Primary Examiner* — Duy T Nguyen
*Assistant Examiner* — Jiyoung Oh
(74) *Attorney, Agent, or Firm* — Syncoda LLC; Feng Ma

(57)                ABSTRACT

A semiconductor structure includes a storage chip, a control chip, and a capacitor structure. The storage chip includes an array area. The control chip includes a peripheral area. The control chip and the storage chip are connected in a face-to-face bonding manner. The capacitor structure is located on a surface, away from a bonding surface, of the storage chip. The capacitor structure includes capacitors electrically connected to corresponding transistors in the array area.

19 Claims, 17 Drawing Sheets

(56)         References Cited

U.S. PATENT DOCUMENTS

| | | | | |
|---|---|---|---|---|
| 2015/0108574 | A1* | 4/2015 | Sung | H01L 21/7624 |
| | | | | 257/506 |
| 2021/0305230 | A1 | 9/2021 | Okajima | |
| 2021/0398943 | A9* | 12/2021 | Chen | H10W 72/0198 |
| 2022/0149149 | A1* | 5/2022 | Huang | H10D 1/716 |
| 2022/0310581 | A1 | 9/2022 | Okajima | |

FOREIGN PATENT DOCUMENTS

| | | | |
|---|---|---|---|
| CN | 112951829 A | 6/2021 | |
| CN | 113078116 A | 7/2021 | |
| CN | 113241347 A | 8/2021 | |
| CN | 114530419 A | 5/2022 | |
| WO | WO-2022042411 A1 * | 3/2022 | H10B 53/20 |

* cited by examiner

31

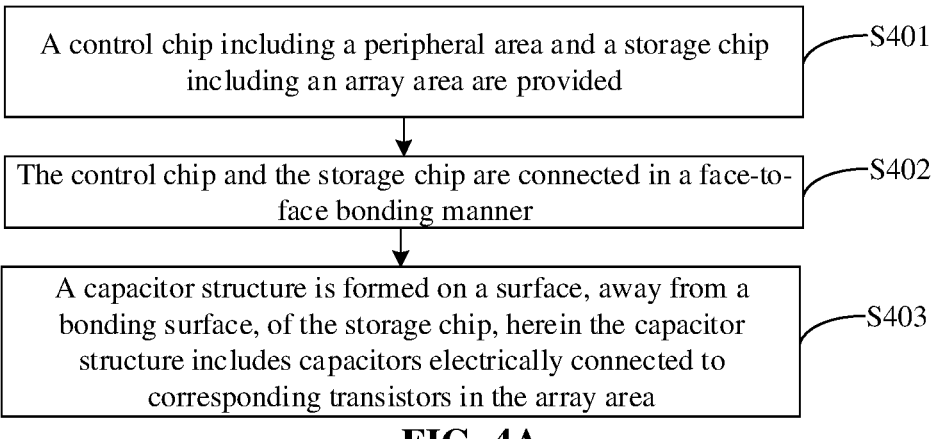

| A control chip including a peripheral area and a storage chip including an array area are provided | S401 |

| The control chip and the storage chip are connected in a face-to-face bonding manner | S402 |

| A capacitor structure is formed on a surface, away from a bonding surface, of the storage chip, herein the capacitor structure includes capacitors electrically connected to corresponding transistors in the array area | S403 |

FIG. 4A

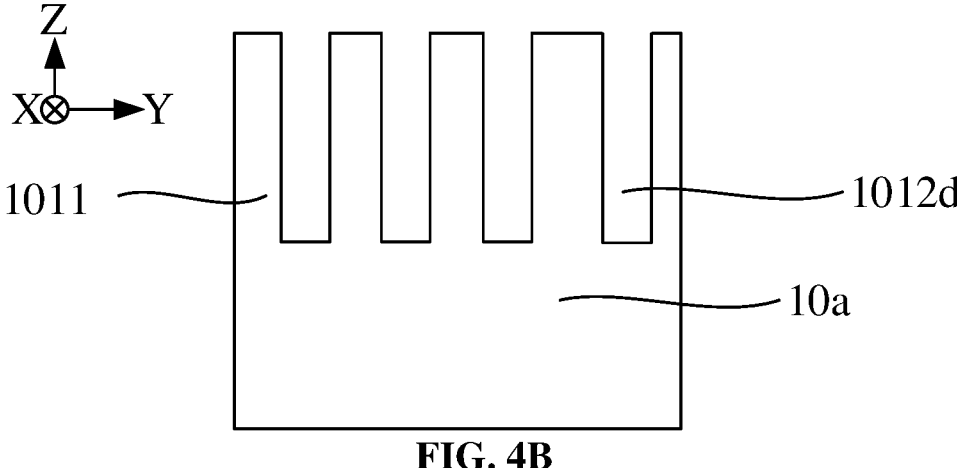

| An insulating structure is formed on a gate-all-around structure and a non-array area | ⌐S404 |

| Contact structures are formed on channel pillars, the contact structures including node contacts and/or landing pads, and the insulating structure on the gate-all-around structure being configured to isolate adjacent contact structures of the contact structures | ⌐S405 |

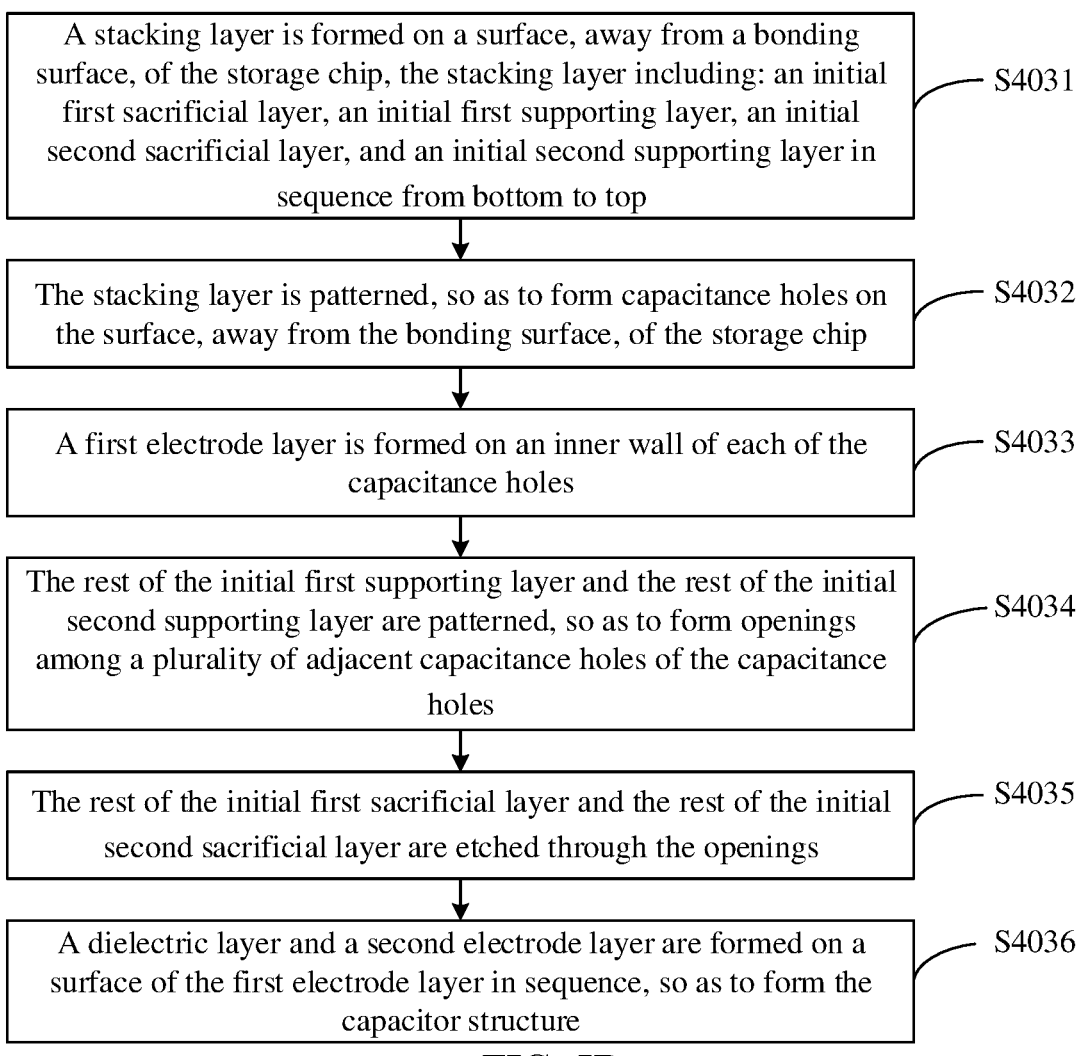

A stacking layer is formed on a surface, away from a bonding surface, of the storage chip, the stacking layer including: an initial first sacrificial layer, an initial first supporting layer, an initial second sacrificial layer, and an initial second supporting layer in sequence from bottom to top — S4031

The stacking layer is patterned, so as to form capacitance holes on the surface, away from the bonding surface, of the storage chip — S4032

A first electrode layer is formed on an inner wall of each of the capacitance holes — S4033

The rest of the initial first supporting layer and the rest of the initial second supporting layer are patterned, so as to form openings among a plurality of adjacent capacitance holes of the capacitance holes — S4034

The rest of the initial first sacrificial layer and the rest of the initial second sacrificial layer are etched through the openings — S4035

A dielectric layer and a second electrode layer are formed on a surface of the first electrode layer in sequence, so as to form the capacitor structure — S4036

FIG. 5B

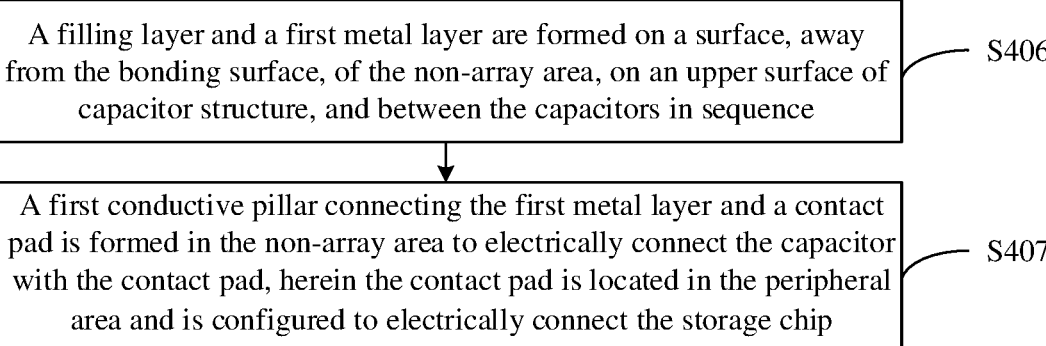

A filling layer and a first metal layer are formed on a surface, away from the bonding surface, of the non-array area, on an upper surface of capacitor structure, and between the capacitors in sequence — S406

A first conductive pillar connecting the first metal layer and a contact pad is formed in the non-array area to electrically connect the capacitor with the contact pad, herein the contact pad is located in the peripheral area and is configured to electrically connect the storage chip — S407

FIG. 6A

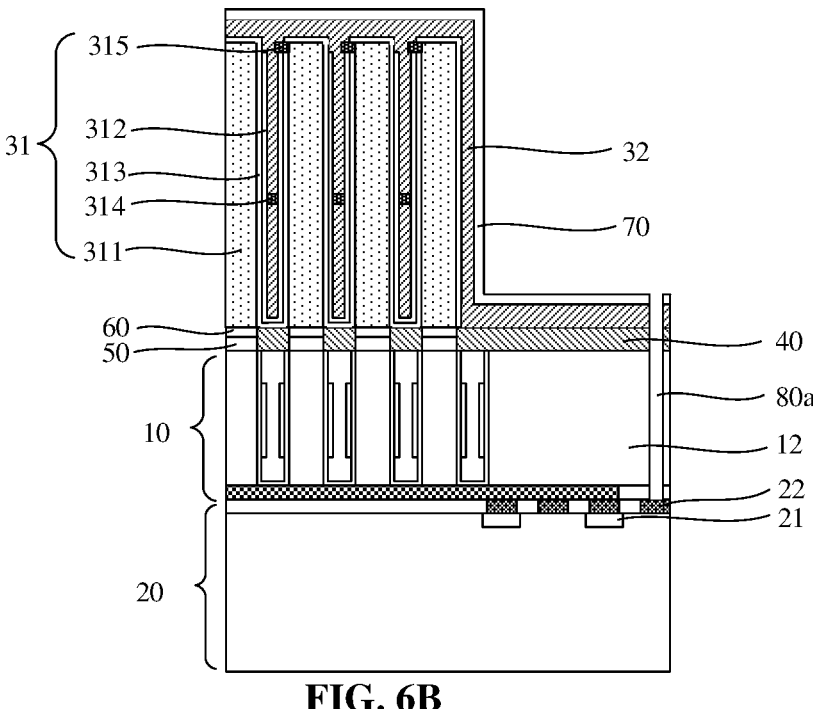

FIG. 6B

SEMICONDUCTOR STRUCTURE COMPRISING STORAGE CHIP BONDED WITH CONTROL CHIP AND METHOD FOR FORMING SAME

CROSS-REFERENCE TO RELATED APPLICATIONS

This is a continuation of International Patent Application No. PCT/CN2022/101005 filed on Jun. 24, 2022, which claims priority to Chinese Patent Application No. 202210610207.5 filed on May 31, 2022. The disclosures of the above-referenced applications are hereby incorporated by reference in their entirety.

BACKGROUND

With the development of miniaturization and thinness of electronic devices, there are corresponding requirements for the volume of memory chips and other semiconductor structures. How to further reduce the dimensions of semiconductor structures is a problem that needs to be solved at present.

SUMMARY

The disclosure relates to the technical field of semiconductors, and relates, but is not limited, to a semiconductor structure and a method for forming the same.

The embodiments of the disclosure provide a semiconductor structure and a method for forming the same.

In a first aspect, the embodiments of the disclosure provide a semiconductor structure, which includes: a storage chip, a control chip, and a capacitor structure. The storage chip includes an array area. The control chip includes a peripheral area. The control chip and the storage chip are connected in a face-to-face bonding manner. The capacitor structure is located on a surface, away from a bonding surface, of the storage chip. The capacitor structure includes capacitors electrically connected to corresponding transistors in the array area.

In a second aspect, the embodiments of the disclosure provide a method for forming a semiconductor structure, including the following operations. A control chip including a peripheral area and a storage chip including an array area are provided; the control chip and the storage chip are connected in a face-to-face bonding manner; and a capacitor structure is formed on a surface, away from a bonding surface, of the storage chip, the capacitor structure including capacitors electrically connected to corresponding transistors in the array area.

BRIEF DESCRIPTION OF THE DRAWINGS

In the drawings (which are not necessarily drawn to scale), similar reference numerals may describe similar parts in different views. Similar reference numerals with different letter suffixes may represent different examples of similar parts. The drawings generally illustrate the various embodiments discussed herein by way of examples rather than limitation.

FIG. 4A illustrates an implementation flowchart of a method for forming another semiconductor structure provided by an embodiment of the disclosure.

FIG. 4B illustrates a first schematic structural diagram of a process for forming a semiconductor structure provided by an embodiment of the disclosure.

FIG. 5B illustrates an implementation flowchart of S403 in a method for forming a semiconductor structure provided by an embodiment of the disclosure.

FIG. 6A illustrates an implementation flowchart of a method for forming another semiconductor structure provided by an embodiment of the disclosure.

FIG. 6B illustrates a schematic structural diagram of a process for forming a semiconductor structure provided by an embodiment of the disclosure.

DETAILED DESCRIPTION

Figure 1A:
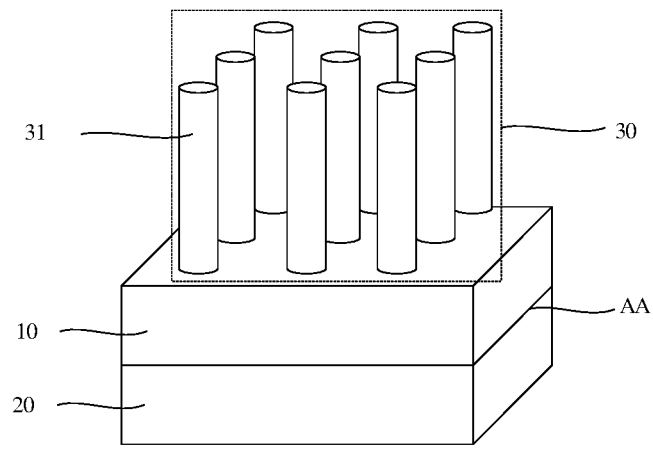
FIG. 1A illustrates a schematic structural diagram of a semiconductor structure provided by an embodiment of the disclosure.

Exemplary implementation modes of the disclosure will be described below in more detail with reference to the drawings. Although the exemplary implementation modes of the disclosure are shown in the drawings, it should be understood that, the disclosure may be implemented in various forms and should not be limited by the specific implementation modes elaborated herein. On the contrary, these implementation modes are provided to enable a more thorough understanding of the disclosure and to fully convey the scope of the disclosure to those skilled in the art.

In the following description, a large number of specific details are given in order to provide a more thorough understanding of the disclosure. However, it will be apparent to those skilled in the art that the disclosure may be implemented without one or more of these details. In other examples, in order to avoid confusion with the disclosure, some technical features known in the art are not described. That is, all the features of the actual embodiments are not described here, and the known functions and structures are not described in detail.

In the drawings, the dimensions of layers, areas, and elements and their relative dimensions may be exaggerated for clarity. Throughout, the same reference numerals represent the same elements.

It is to be understood that description that an element or layer is "above", "adjacent to", "connected to", or "coupled to" another element or layer may refer to that the element or layer is directly above, adjacent to, connected to or coupled to the other element or layer, or there may be an intermediate element or layer. On the contrary, description that an element is "directly on", "directly adjacent to", "directly connected to" or "directly coupled to" another element or layer refers to that there is no intermediate element or layer. It is to be understood that, although various elements, components, areas, layers, and/or parts may be described with terms first, second, third, etc., these elements, components, areas, layers, and/or parts should not be limited to these terms. These terms are used only to distinguish one element, component, area, layer or part from another element, component, area, layer or part. Therefore, a first element, component, area, layer, or part discussed below may be represented as a second element, component, area, layer, or part without departing from the teaching of the disclosure. However, when second element, component, area, layer, or part is discussed, it does not mean that the first element, component, area, layer, or part must exist in the disclosure.

The terms used herein are intended only to describe specific embodiments and are not a limitation of the disclosure. As used herein, singular forms "a/an", "one", and "the" may also be intended to include the plural forms, unless otherwise specified types in the context. It is also to be understood that, when terms "composed of" and/or "including" are used in this specification, the presence of the features, integers, steps, operations, elements, and/or components may be determined, but the presence or addition of one or more other features, integers, steps, operations, elements, components, and/or groups is also possible. As used herein, terms "and/or" includes any and all combinations of the related listed items.

In view of this, the embodiments of the disclosure provide a semiconductor structure, simultaneously referring to FIG.

Figure 1B:
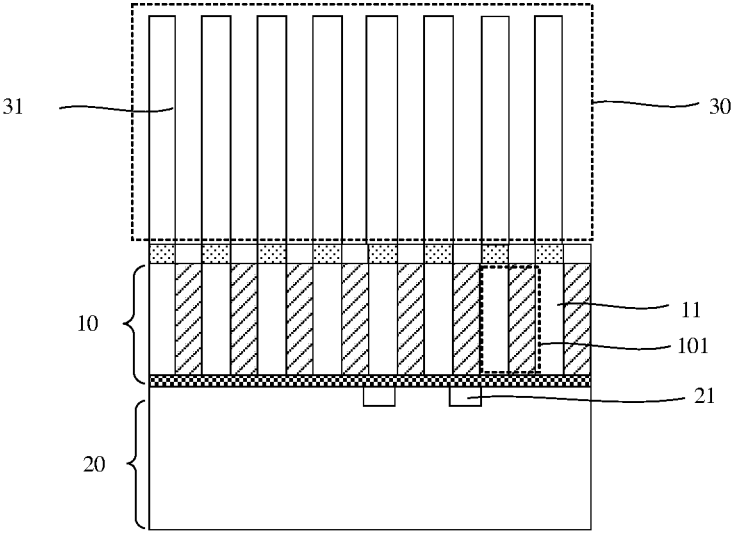
FIG. 1B illustrates a schematic structural diagram of a semiconductor structure provided by an embodiment of the disclosure.

1A and FIG. 1B, including: a storage chip 10, a control chip 20, and a capacitor structure 30.

The storage chip 10 includes an array area 11, and the control chip 20 includes a peripheral area 21.

The control chip 20 and the storage chip 10 are connected in a face-to-face bonding manner.

The capacitor structure 30 is located on a surface, away from a bonding surface, of storage chip 10. The capacitor structure 30 includes capacitors 31 electrically connected to corresponding transistors 101 in the array area 11.

Here, "face-to-face bonding" refers to a front surface of one chip is bonded to a front surface of the other chip. The front surface of the chip usually includes functional areas such as a device area (or an active area) and interconnection lines. A back surface of the chip is the other surface opposite to the front side. During implementation, a face-to-face bonding connection mode between the storage chip and the control chip may include direct bonding, hot pressing bonding, plasma activated bonding, bonding agent bonding, etc.

A capacitor may be a columnar capacitor or a tubular capacitor, for example, a cylindrical capacitor, a square capacitor or a columnar capacitor of other shapes. During implementation, the number of the capacitors may be determined according to the number of the transistors.

In the embodiments of the disclosure, the semiconductor structure includes the storage chip and the control chip connected in a face-to-face bonding manner, and the capacitor structure located on the surface, away from the bonding surface of the storage chip. On the one hand, the storage chip and the control chip are connected in a face-to-face bonding manner, that is, the storage chip and the control chip are stacked by facing a front surface of the storage chip to a front surface of the control chip. Compared with a plane semiconductor structure, the dimension of the semiconductor structure can be reduced, so as to realize better miniaturization. Compared with other bonding modes, the control chip and the storage chip are connected in a face-to-face bonding manner, so that the number and the complexity of conductive routes can be minimized, the formation of the control chip and the storage chip becomes easier while maintaining the expected yield. On the other hand, the storage chip and the control chip forming the semiconductor structure in the embodiments of the disclosure may be produced at the same time, and then are bonded. Thus, the production time can be shortened, so as to improve the production efficiency.

Before introducing the embodiments of the disclosure, three directions for describing a three-dimensional structure that may be used in the following embodiments are defined first. Taking a Cartesian coordinate system as an example, the three directions may include an X-axis direction, a Y-axis direction, and a Z-axis direction. In the direction of the top surface and the bottom surface (that is, the plane on which the storage chip is located) of storage chip, two directions that intersect each other (e.g., perpendicular to each other) are defined. For example, a direction in which a channel pillar extends may be defined as the first direction, a direction in which channel pillars are arranged may be defined as a second direction, and a plane direction of the storage chip may be determined on the basis of the first direction and the second direction. The storage chip may include a top surface located on a front side and a bottom surface located on a back side opposite to the front side. A direction perpendicular to the top surface and the bottom surface of the storage chip is defined as the third direction in a case of ignoring the flatness of the top surface and the bottom surface. It can be seen that the first direction, the second direction, and the third direction are perpendicular to each other in pairs. In the embodiments of the disclosure, the first direction is defined as the X-axis direction, the second direction is defined as the Y-axis direction, and the third direction is defined as the Z-axis direction.

Figure 2A:
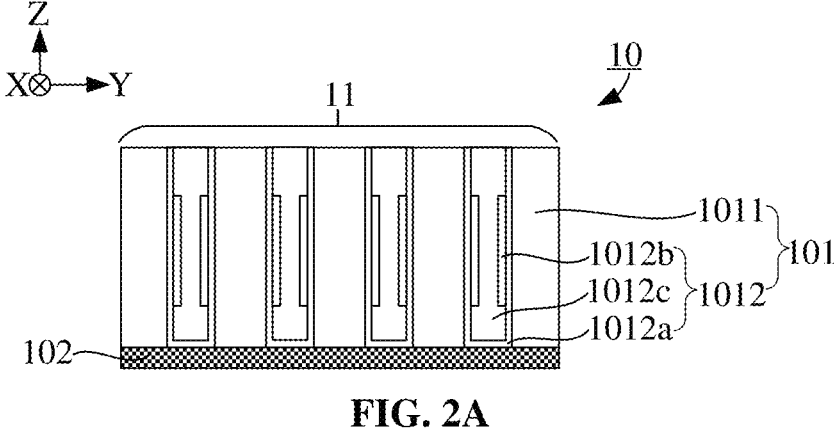
FIG. 2A illustrates a first schematic structural diagram of a semiconductor structure provided by an embodiment of the disclosure.

In some embodiments, referring to FIG. 2A, each of the transistors 101 in the storage chip 10 includes: a channel pillar 1011 and a gate-all-around structure 1012 surrounding the channel pillar 1011. The channel pillars 1011 extend in the first direction (X-direction) and are arranged in the second direction (Y-direction). The capacitor is electrically connected on one end of the channel pillar 1011, so that the capacitor is electrically connected to the transistor. Two ends of the channel pillar may respectively serve as a source area and a drain area of the transistor. In the embodiments of the disclosure, in a first aspect, the gate-all-around structure may surround the channel pillar, so that the area of the semiconductor structure in a plane space can be further reduced, and the number of the channel pillars per unit area can be increased to increase the number of the capacitors, thereby improving the density of the capacitors, and improving the storage capacity of the semiconductor structure. In a second aspect, the capacitor structure and the bit line structure may be located at two ends of the channel pillar, so that the difficulty of a manufacturing process in the array area can be reduced. In a third aspect, the gate-all-around structure has a wide channel area, so that a short channel effect can be reduced, thereby improving the performance of the storage chip.

During implementation, a shape of a projection of the channel pillar onto a back surface (i.e., the surface away from the bonding surface) of the storage chip may include a circle, an ellipse, a rectangle, a trapezoid, or a diamond. No limits are made thereto in the embodiments of the disclosure.

In some embodiments, referring to FIG. 2A, the gate-all-around structure 1012 may include: a gate dielectric layer 1012a, a gate metal layer 1012b, and an insulating layer 1012c.

The gate dielectric layer 1012a is located on an outer wall of the channel pillar 1011.

The gate metal layer 1012b is in contact with a side wall of the gate dielectric layer 1012a.

The insulating layer 1012c is located in a groove between adjacent channel pillars 1011 of the channel pillars, and fully fills the groove.

Here, the gate-all-around structure may include a gate and a word line. During implementation, the material used by the gate dielectric layer may be a high-K dielectric material, for example, one of lanthanum oxide ($La_2O_3$), aluminum oxide ($Al_2O_3$), hafnium oxide ($HfM_2$), hafnium oxynitride (HfON), hafnium silicate ($HfSiO_x$), or zirconium oxide ($ZrO_2$) or any combination thereof. The problem of gate leakage current can be improved by taking the high-K dielectric material as the gate dielectric layer.

The material of the gate metal layer may include one of polycrystalline silicon, metal (e.g. tungsten, copper, aluminum, titanium, tantalum, ruthenium, etc.), metal alloy, metal silicide, titanium nitride, and other conductive materials, or any combination thereof.

The material used by the insulating layer may be one of silicon nitride, silicon oxynitride, and silicon oxide, or any combination thereof.

In some embodiments, referring to FIG. 2A, the array area 11 in the storage chip 10 further includes: a bit line structure 102. The bit line structure 102 is located on a surface, close to the bonding surface (not shown), of the storage chip 10. With reference to FIG. 1B and FIG. 2A, it can be known that the bit line structure 102 and the capacitor structure 30 are respectively located on two opposite sides of the storage chip 10. The bit line structure 102 is electrically connected to both the control chip 20 and the channel pillars 1011. During implementation, the bit line structure may be electrically connected to the peripheral circuit through a contact pad on the control chip, so that part of devices in the peripheral circuit can be correspondingly electrically connected to the bit line structure, thereby realizing data reading or writing of a storage cell.

The material used by the bit line structure may be a conductive material, such as one or more of polycrystalline silicon, metal silicides, conductive metal nitrides (such as titanium nitride (TiN), tantalum nitride (TaN), and tungsten nitride (WN)), and metals (such as tungsten, titanium, and tantalum).

In the embodiments of the disclosure, a transistor in the array area (which may include a gate-all-around structure, a drain area, and a source area) and a capacitor of the capacitor structure may form a storage cell. The capacitor may be coupled to the source area/drain area in the transistor, so as to charge or discharge through the source area/drain area. The word line in the gate-all-around structure may be coupled to a gate of the transistor, so as to turn on or turn off the transistor. The bit line structure may be coupled to a drain area/source area of the transistor, and act as a path for charging or discharging the capacitor.

Figure 2B:
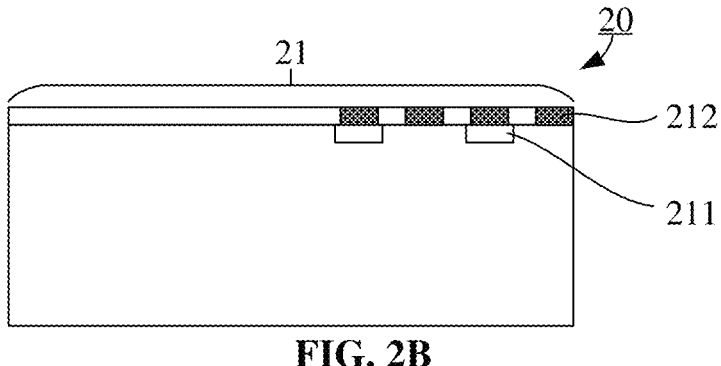
FIG. 2B illustrates a second schematic structural diagram of a semiconductor structure provided by an embodiment of the disclosure.

In some embodiments, referring to FIG. 2B, the peripheral area 21 in the control chip 20 includes a peripheral circuit 211 and a contact pad 212. The peripheral circuit 211 is configured to control the turn-on or turn-off of the transistor, so as to store data into the corresponding capacitor, and/or read data from the corresponding capacitor.

During implementation, the material used by the contact pad may be a metal material, such as tungsten, titanium, and tantalum. The function of the contact pad is to electrically connect the control chip and the storage chip. In order to reduce short circuit between adjacent contact pads, an isolation material may be filled between adjacent contact pads.

Here, the peripheral area may include peripheral transistors. The peripheral transistors are configured to form the peripheral circuit. In some embodiments, the peripheral circuit may also include a row decoder, a column decoder, an input/output controller, a multiplexer, a sense amplifier, etc. The row decoder is coupled to the word line of the storage cell, and is configured to turn on or turn off the gate of the transistor. The column decoder is coupled to the bit line structure of the storage cell, and is configured to perform reading or writing on the storage cell. The input/output controller is configured to control input and output signals. The multiplexer is a data selector, and is configured to select an input signal from several input signals and forward the selected input signal to a single output line. The sense amplifier is configured to sense a voltage difference between the bit line structure and a complementary bit line structure, and amplify the voltage difference to a recognizable logic level, so that data can be correctly interpreted by a logic unit outside a memory device, thereby realizing the control of the storage cell to store the data into the corresponding capacitor, and/or to read data from the corresponding capacitor.

Figure 2C:
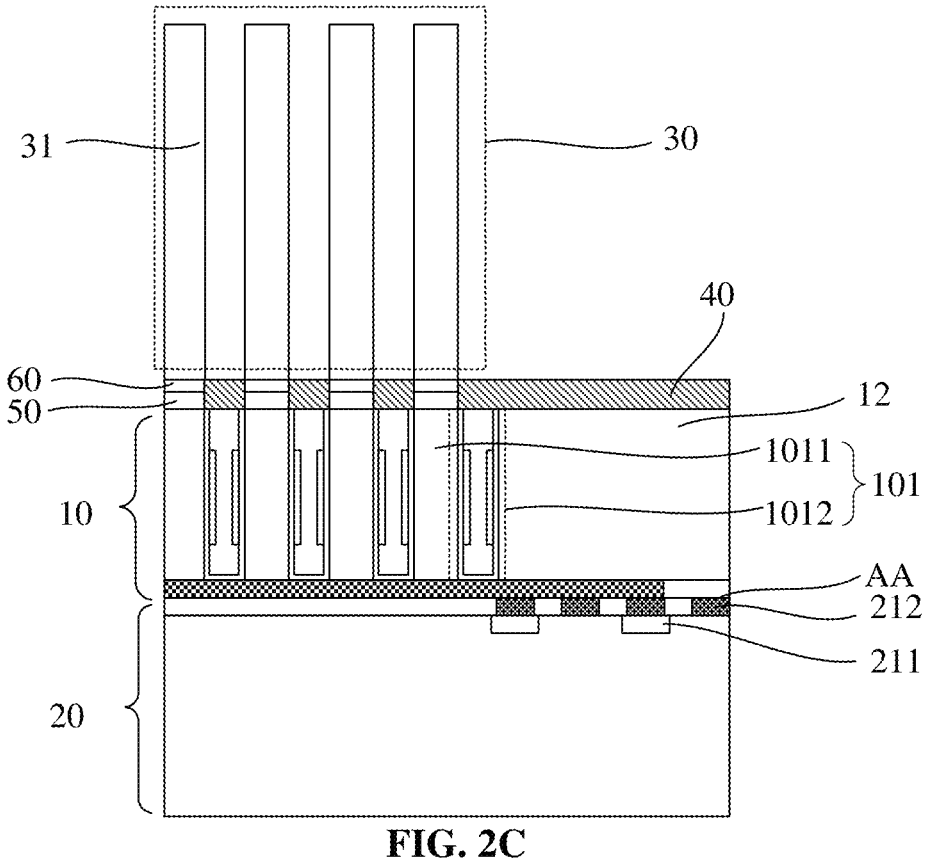
FIG. 2C illustrates a third schematic structural diagram of a semiconductor structure provided by an embodiment of the disclosure.

In some embodiments, referring to FIG. 2C, the storage chip 10 further includes a non-array area 12. A plurality of conductive pillars electrically connected to the storage chip 10 and the control chip 20 may be arranged in the non-array area 12. The semiconductor structure may further include: an insulating structure 40, node contacts 50 and landing pads 60.

The insulating structure 40 is located on the gate-all-around structures 1012 and the non-array area 12.

The node contacts 50 and landing pads 60 are located on the channel pillars 1011. The capacitors 31 in capacitor structure 30 are electrically connected to the transistors 101 in the array area 11 through the node contacts 50 and the landing pads 60.

In some embodiments, there may be a node contact on the channel pillar. The capacitor may be electrically connected to the transistor through the node contact. In some another embodiments, there may be a landing pad on the channel pillar. The capacitor may be electrically connected to the transistor through the landing pad.

Here, the material used by the insulating structure may include at least one of silicon oxide, silicon nitride, and silicon oxynitride. The material used by the node contact may include polycrystalline silicon doped with impurities or polycrystalline silicon without impurities. The material used by the landing pad may be a conductive material, such as tungsten and tantalum. The capacitor may be formed on a surface of the landing pad. The function of the landing pad is to electrically connect the node contact with the capacitor, or electrically connect the transistor with the capacitor.

In the embodiments of the disclosure, the insulating structure configured to isolating adjacent node contacts (and/or landing pads) is arranged on the channel pillar, and the insulating structure is arranged on the non-array area, so that the short circuit in the semiconductor structure can be reduced. The node contacts and the landing pads are arranged, so that the contact resistance between the source area/drain area and the capacitor can be reduced.

Figure 3A:
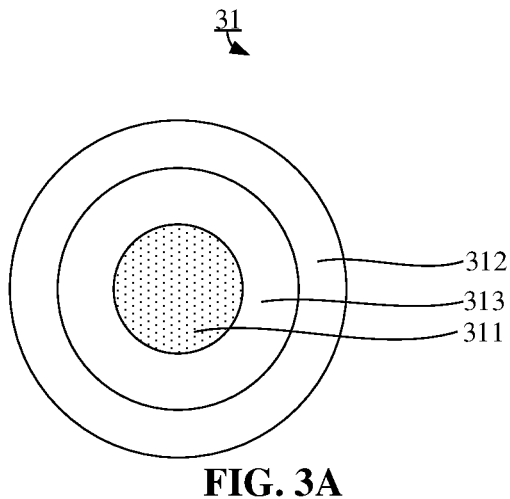
FIG. 3A illustrates a schematic structural diagram of a capacitor provided by an embodiment of the disclosure.

In some embodiments, referring to FIG. 3A, the capacitor 31 includes: a first electrode layer 311, a second electrode layer 312, and a dielectric layer 313 located between the first electrode layer 311 and the second electrode layer 312. The first electrode layer 311 is electrically connected to the storage chip.

During implementation, the material of the first electrode layer may include metal nitride (such as titanium nitride) and/or metal silicide. The material used by the second electrode layer may include a metal nitride and/or a metal silicide. The material used by the dielectric layer may include at least one of zirconium oxide, hafnium oxide, titanium zirconium oxide, ruthenium oxide, antimony oxide, or aluminum oxide.

Figure 3B:
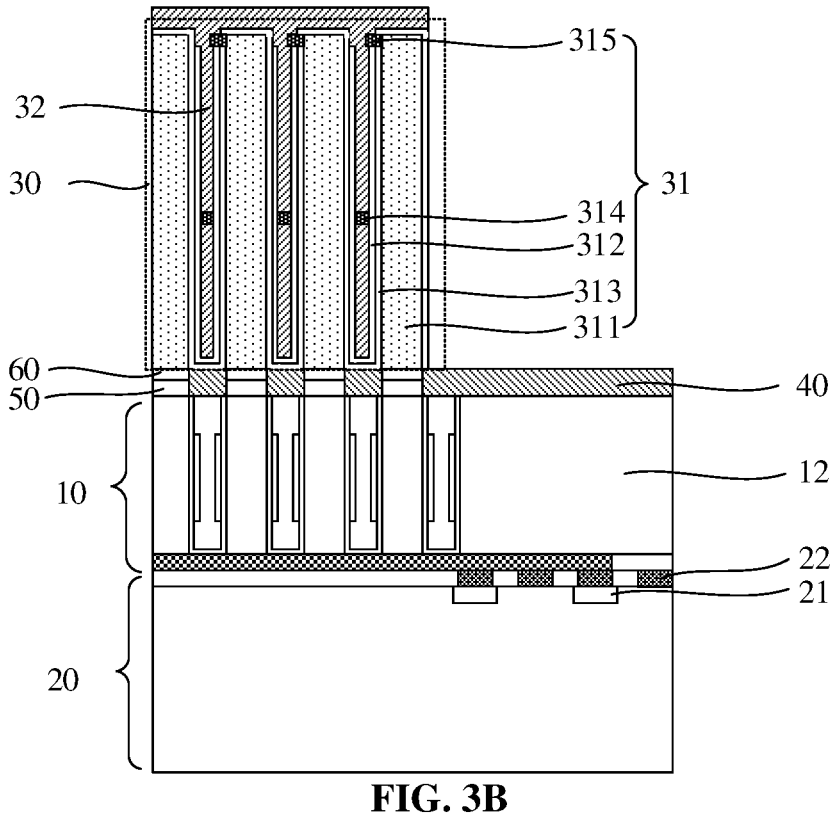
FIG. 3B illustrates a first schematic structural diagram of a semiconductor structure provided by an embodiment of the disclosure.

In some embodiments, referring to FIG. 3B, there is a first supporting layer 314 and a second supporting layer 315 arranged in parallel between the adjacent capacitors 31. The first supporting layer 314 is arranged on a periphery of a middle part of the capacitor 31. The second supporting layer 315 is arranged on a periphery of a top part of the capacitor 31. The first supporting layer 314 and the second supporting layer 315 are configured to support the capacitor 31 together.

In some embodiments, the material used by the first supporting layer and the second supporting layer may include at least one of silicon oxide, silicon nitride, nitrogen silicon carbide, and silicon oxynitride. During implementation, the material used by the first supporting layer may be the same as that used by the second supporting layer. The material used by the first supporting layer may also be different from that used by the second supporting layer.

In the embodiments of the disclosure, the first supporting layer is arranged on the periphery of the middle part of the capacitor, and the second supporting layer is arranged on the periphery of the top part of the capacitor. Therefore, it can be known that the first supporting layer and the second supporting layer are arranged at different heights. That is to say, the capacitor structure is supported at two different heights, which makes the capacitor structure not easy to collapse and more stable.

In some embodiments, referring to FIG. 3B, the capacitor structure 30 further includes: a filling layer 32 located between adjacent capacitors 31. During implementation, the filling layer 32 may include, but is not limited to, a silicon layer or a silicon germanide (GeSi) layer, and is configured to connect the second electrode layer 312.

Figure 3C:
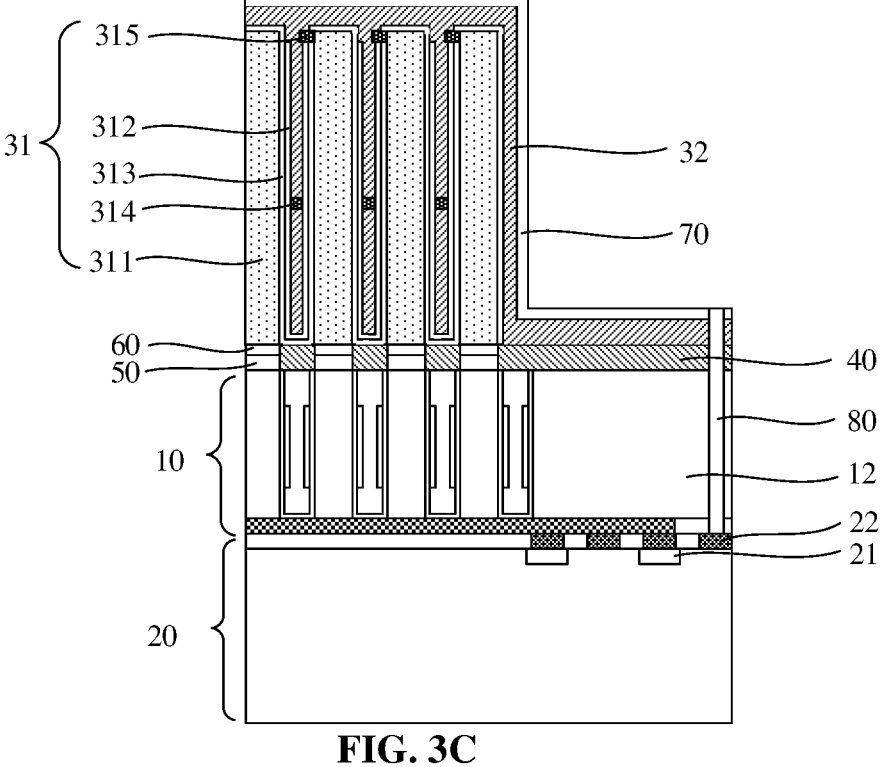
FIG. 3C illustrates a second schematic structural diagram of a semiconductor structure provided by an embodiment of the disclosure.

In some embodiments, referring to FIG. 3C, the semiconductor structure further includes a filling layer 32, a first metal layer 70, and a first conductive pillar 80.

The filling layer 32 is located on a surface, away from the bonding surface, of the non-array area 12, on an upper surface of capacitor structure, and between the capacitors 31. The filling layer 32 is electrically connected to the second electrode layer 312.

The first metal layer 70 is located on the filling layer 32.

The first conductive pillar 80 is located in the non-array area 12. Two ends of the first conductive pillar 80 are respectively connected to the first metal layer 70 and the contact pad 22, to electrically connect the capacitors 31 and the contact pad 22.

Here, the filling layer includes two parts: the first part is the filling layer located between adjacent capacitors, and the second part is the filling layer located on the surface of the non-array area (or the insulating structure) in the storage chip. The level of the filling layer of the first part may be higher than that of the capacitor structure. Thus, the level of the filling layer is higher than that of the second electrode layer, so that the second electrode layers of the capacitor structure may be connected together better, and the capacitor structure may be electrically connected to the contact pad in the control chip more easily subsequently.

In some embodiments, the material used by the first conductive pillar may be polycrystalline silicon, copper, aluminum, cobalt, tungsten, metal alloy, or the like. The extending direction of the first conductive pillar is the third direction (Z-axis direction). There may be one, two, or a plurality of first conductive pillar(s). The first conductive pillar may be a wire, which on the one hand, can be used as a connection channel between the capacitor structure and the control chip to connect the capacitor structure to the peripheral circuit, so that the capacitor of the capacitor structure can be controlled through the peripheral circuit (for example, applying a voltage to the capacitor), and on the other hand, can also lead out a line from the control chip and rearrange an input/output interface.

In some embodiments, the material used by the first metal layer may be a metal (such as tungsten, cobalt, and aluminum), a metal alloy, or the like. The function of the first metal layer is to electrically connect the capacitor and the control chip, which can reduce the contact resistance between the capacitor and the control chip, thereby reducing the power consumption of devices.

Figure 3D:
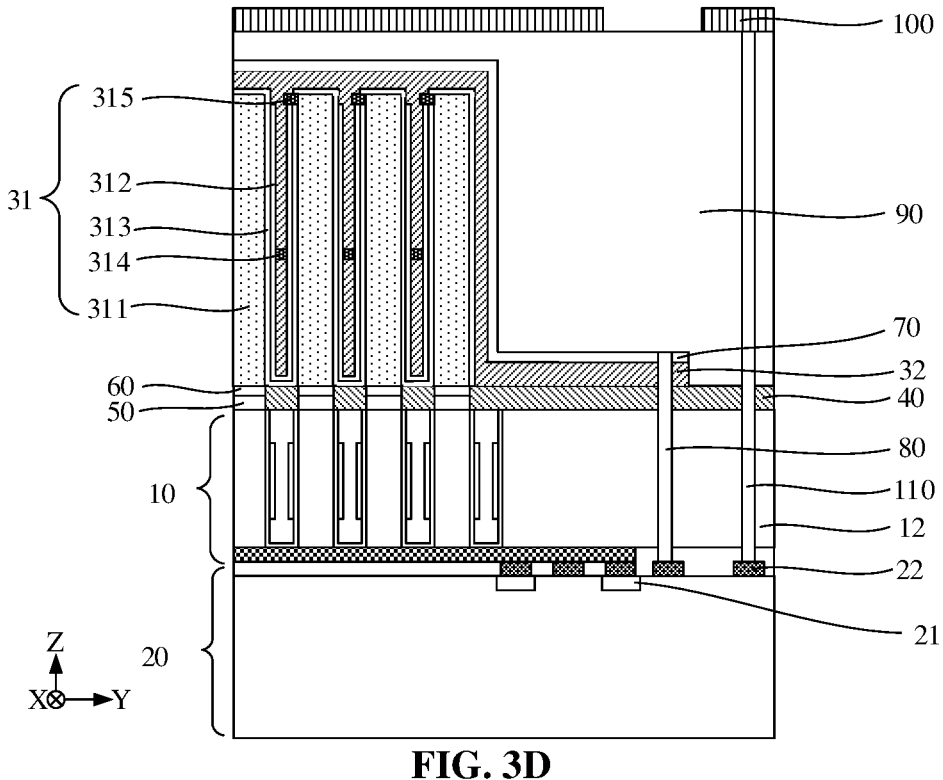
FIG. 3D illustrates a third schematic structural diagram of a semiconductor structure provided by an embodiment of the disclosure.

In some embodiments, referring to FIG. 3D, the semiconductor structure further includes: an interlayer dielectric 90, a second metal layer 100, and a second conductive pillar 110.

The interlayer dielectric 90 is located on the first metal layer 70 and the insulating structure 40.

The second metal layer 100 is located on the interlayer dielectric 90.

The second conductive pillar 110 is configured to connect the second metal layer 100 with the contact pad 22.

The second conductive pillar 110 penetrates through the interlayer dielectric 90, the insulating structure 40, and the non-array area 12. The second conductive pillar 110 is configured to electrically connect the second metal layer 100 to the contact pad 22. In the embodiments of the disclosure, the second conductive pillar is configured to electrically connect the contact pad to the second metal layer. Since the contact pad is part of the control chip, the electrical connection between the second metal layer and the control chip are implemented by the second conductive pillar. The second conductive pillar is further configured to electrically connect a re-wiring layer (i.e., the second metal layer) to lead a line from the control chip and rearrange an input/output interface.

It can be seen from FIG. 3D that the dimension of each of the filling layer 32 and the first metal layer 70 in the second direction is smaller than the dimension of the insulating structure 40 in the second direction, that is to say, the second conductive pillar 110 does not penetrate through the filling layer 32 and the first metal layer 70. Thus, the first conductive pillar 80 is not communicated with the second conductive pillar 110, so that the first conductive pillar 80 and the second conductive pillar 110 do not affect each other.

FIG. 3D only illustrates one second conductive pillar and the extending direction of the second conductive pillar is the third direction (Z-axis direction). During implementation, any number of second conductive pillars may be arranged as required. No limits are made thereto in the embodiments of the disclosure. The function of the interlayer dielectric is not only to isolate the adjacent second conductive pillars, but also to isolate the first metal layer from the second metal layer.

During implementation, the second metal layer may be used as a bonding pad. In this case, the whole layer where the second metal layer is located may include bonding pads and an isolation material used for isolating the bonding pads. The isolation material is arranged between adjacent bonding pads, so that the leakage current between the bonding pads is reduced.

In some embodiments, the material used by the interlayer dielectric may include at least one of: Boro-phospho-silicate Glass (BPSG), Un-doped Silicate Glass (USG), Phospho Silicate Glass (PSG), Tetraethyl Orthosilicate (TEOS), silicon tetrahydride ($SiH_4$) oxide, silicon dioxide, a Spin On Dielectric (SOD), or other appropriate dielectrics.

The material used by the second metal layer may be one or more of metal silicide, conductive metal nitride (such as titanium nitride, tantalum nitride, and tungsten nitride), and metal (such as tungsten, copper, titanium, and tantalum). During implementation, the material used by the second metal layer may be the same as that used by the first metal layer. The material used by the second metal layer may also be different from that used by the first metal layer.

The embodiments of the disclosure provide a method for forming a semiconductor structure, referring to FIG. 4A, including S401 to S403.

At S401, a control chip including a peripheral area and a storage chip including an array area are provided.

Referring to FIG. 2A, a storage chip 10 including an array area 11 is provided. Referring to FIG. 2B, a control chip 20 including a peripheral area 21 is provided.

At S402, the control chip and the storage chip are connected in a face-to-face bonding manner.

Referring to FIG. 2C, the control chip 20 and the storage chip 10 are connected in a face-to-face bonding manner. A bonding surface is denoted by AA. In the embodiments of the disclosure, the control chip and the storage chip are bonded face to face, which can not only arrange a subsequent bit line structure above the transistor, but also reduce the process difficulty in forming the bit line structure. The surface of the bit line structure may serve as the bonding surface, so that the electrical conductivity of the bit line structure may be increased, and the transmission performance of the bit line structure can be improved. In addition, the control chip and the storage chip are bonded face to face, so that the number and the complexity of conductive routes can be minimized, the formation of the control chip and the storage chip becomes easier while maintaining the expected yield.

At S403, a capacitor structure is formed on a surface, away from a bonding surface, of the storage chip, herein the capacitor structure having capacitors electrically connected to corresponding transistors in the array area.

Referring to FIG. 2C, a capacitor structure 30 is formed on a surface, away from the bonding surface AA, of the storage chip 10. Capacitors 31 of the capacitor structure 30 are electrically connected to the corresponding transistors 101 in the array area 11.

In some embodiments, referring to FIG. 2A, each of the transistors 101 includes: a channel pillar 1011 and a gate-all-around structure 1012 surrounding the channel pillar 1011. Correspondingly, a method for forming the storage chip includes the following steps.

At S4011, an initial substrate including the channel pillars and grooves extending in a first direction and arranged in a second direction is provided.

Referring to FIG. 4B, an initial substrate 10a is provided. The initial substrate 10a includes the channel pillars 1011 and grooves 1012b extending in a first direction (X-axis direction) and arranged in a second direction (Y-axis) direction. During implementation, the initial substrate may include a silicon substrate, a silicon substrate on insulator, a germanium substrate, a germanium substrate on insulator, a germanium silicon substrate, etc. The initial substrate may also include other semiconductor elements, such as germanium; or include semiconductor compounds, such as silicon carbide, gallium arsenide, gallium phosphide, indium phosphide, indium arsenide or indium antimonide; or include other semiconductor alloys, such as silicon germanium, arsenic gallium phosphide, indium aluminum arsenide, aluminum gallium arsenide, indium gallium arsenide, indium gallium phosphide, and/or indium gallium arsenide phosphide, or combinations thereof.

At S4012, the gate-all-around structure surrounding the channel pillar is formed.

Here, the gate-all-around structure is formed in the groove. In some embodiments, the gate-all-around structure includes: a gate dielectric layer, a first sub-insulating layer, a gate metal layer, and a second sub-insulating layer. Correspondingly, the operation that the gate-all-around structure surrounding the channel pillar is formed includes S11 to S14.

At S11, the gate dielectric layer is formed on an outer wall of the channel pillar.

Figure 4C:
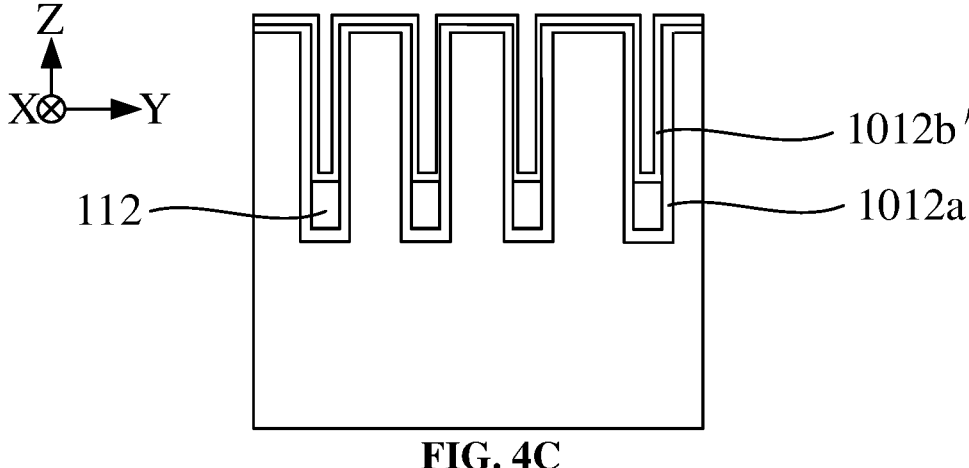
FIG. 4C illustrates a second schematic structural diagram of a process for forming a semiconductor structure provided by an embodiment of the disclosure.

Referring to FIG. 4C, the gate dielectric layer 1012a is formed on an outer wall of the channel pillar 1011, that is, the gate dielectric layer 1012a is formed in the groove. During implementation, the gate dielectric layer may be formed through any suitable deposition process, such as a Chemical Vapor Deposition (CVD) process, a Physical Vapor Deposition (PVD) process, an Atomic Layer Deposition (ALD) process, a spin coating process, or a coating process.

At S12, the first sub-insulating layer is formed at a bottom of a groove in which the gate dielectric layer is formed.

Referring to FIG. 4C, the first sub-insulating layer 112 is formed at a bottom of a groove (which is not shown, but may refer to FIG. 4B) where the gate dielectric layer 1012a is formed. Here, the material used by the first sub-insulating layer may be silicon nitride, and may be formed by appropriate processes, such as the CVD process and the ALD process.

At S13, the gate metal layer surrounding the channel pillar is formed on the channel pillar.

Figure 4D:
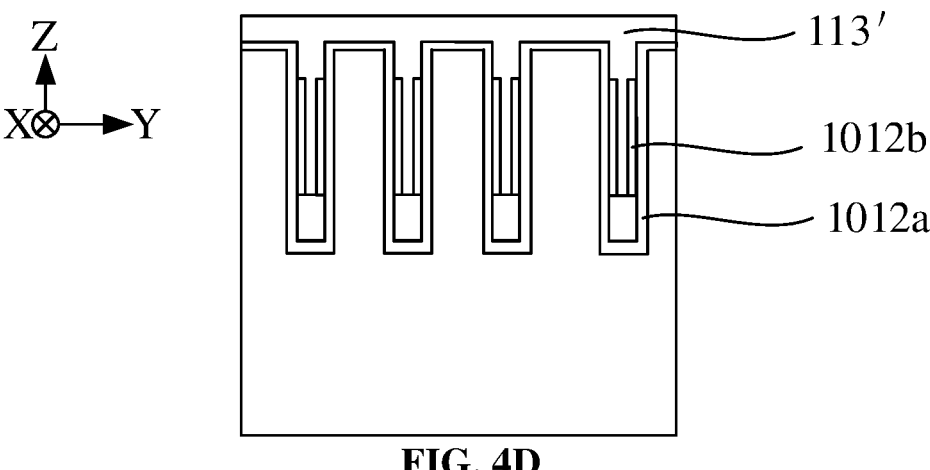
FIG. 4D illustrates a third schematic structural diagram of a process for forming a semiconductor structure provided by an embodiment of the disclosure.

Referring to FIG. 4C, an initial gate metal layer 1012b' is formed on channel pillars on which the gate dielectric layer is formed. A top surface of the initial gate metal layer 1012b' may be higher than a top surface of the initial substrate. Part of the initial gate metal layer 1012b' is etched, so as to obtain the gate metal layer 1012b as shown in FIG. 4D. Here, the gate metal layer surrounds the channel pillar. That is to say, there are two parts of the gate metal layer in the groove. However, these two parts of the gate metal layer are not in contact with each other, and there is a gap reserved therebetween.

At S14, the second sub-insulating layer which is flush with the surface of the initial substrate is formed in the groove.

Figure 4E:
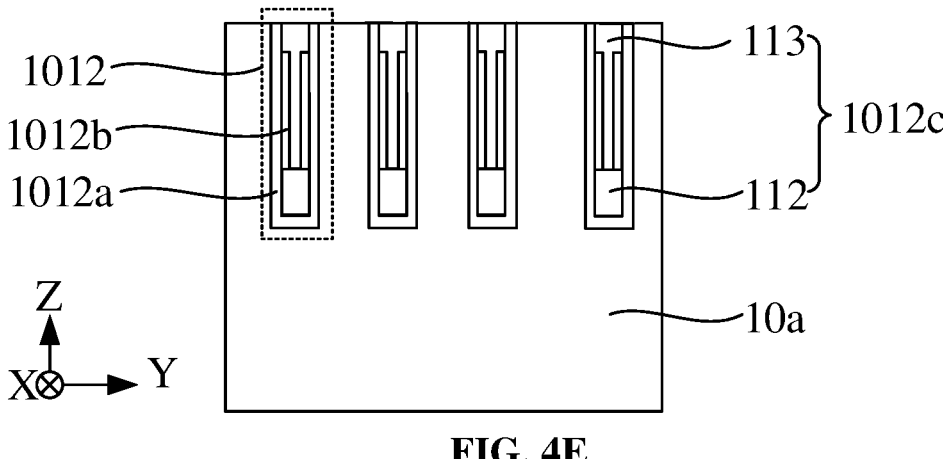
FIG. 4E illustrates a fourth schematic structural diagram of a process for forming a semiconductor structure provided by an embodiment of the disclosure.

Referring to FIG. 4D, an initial second sub-insulating layer 113' is formed in the groove. A top surface of the initial second sub-insulating layer 113' is higher than the top surface of the initial substrate 10a. After that, the initial second sub-insulating layer 113' above the top surface of the initial substrate 10a is removed by chemical mechanical grinding, dry etching, wet etching or any combination thereof (and the gate dielectric layer 1012a above the top surface of the initial substrate is removed), so as to obtain a second sub-insulating layer 113 as shown in FIG. 4E, which is flush with the surface of the initial substrate 10a. The second sub-insulating layer 113 and the first sub-insulating layer 112 are communicated with each other. The materials used by the two may be the same or may be different. Referring to FIG. 4E, the insulating layer 1012c includes the second sub-insulating layer 113 and the first sub-insulating layer 112. The gate-all-around structure 1012 includes: the gate dielectric layer 1012a, the first sub-insulating layer 112, the gate metal layer 1012b, and the second sub-insulating layer 113.

During implementation, the material used by the initial second sub-insulating layer may be silicon nitride, which may be formed by the same process as the first sub-insulating layer.

In some embodiments, the array area further includes: a bit line structure electrically connected to the channel pillars and control chip. A method for forming the storage chip further includes the following step.

At S15, the bit line structure is formed on a surface of the initial substrate where the gate-all-around structure is formed.

Figure 4F:
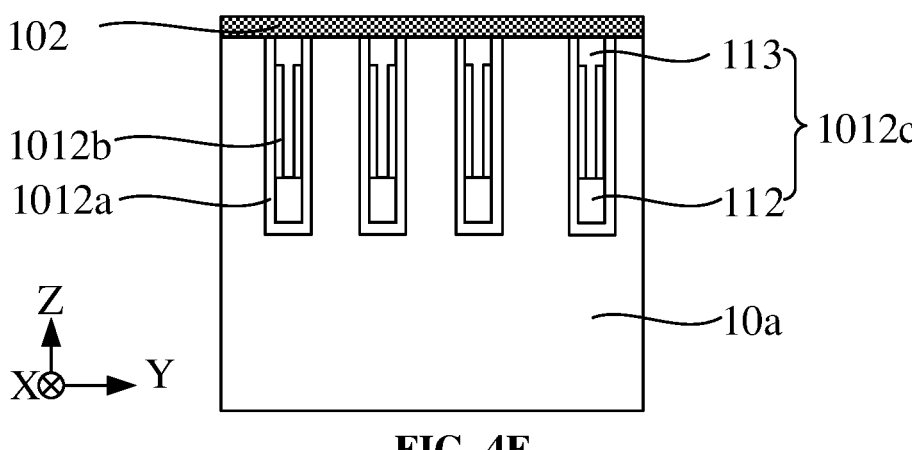
FIG. 4F illustrates a fifth schematic structural diagram of a process for forming a semiconductor structure provided by an embodiment of the disclosure.

Referring to FIG. 4E, a conductive material is deposited on the surface of the initial substrate 10a where the gate-all-around structure 1012 is formed, so as to form the bit line structure 102 as shown in FIG. 4F, which is located above the transistor. Here, since the bit line structure may be directly formed above the transistor, the forming difficulty in forming the bit line structure can be reduced.

In some embodiments, if the surface of the bottom of the gate-all-around structure is not exposed, that is, the dimension of the gate-all-around structure in the third direction are smaller than the dimension of the initial substrate in the third direction, so there may be a situation that the gate-all-around structure cannot be electrically connected to a subsequently formed capacitor structure. Therefore, the method for forming the storage chip further includes the following operation.

At S16, thinning treatment is performed on the initial substrate until a surface of a bottom of the gate-all-around structure is exposed.

Figure 4G:
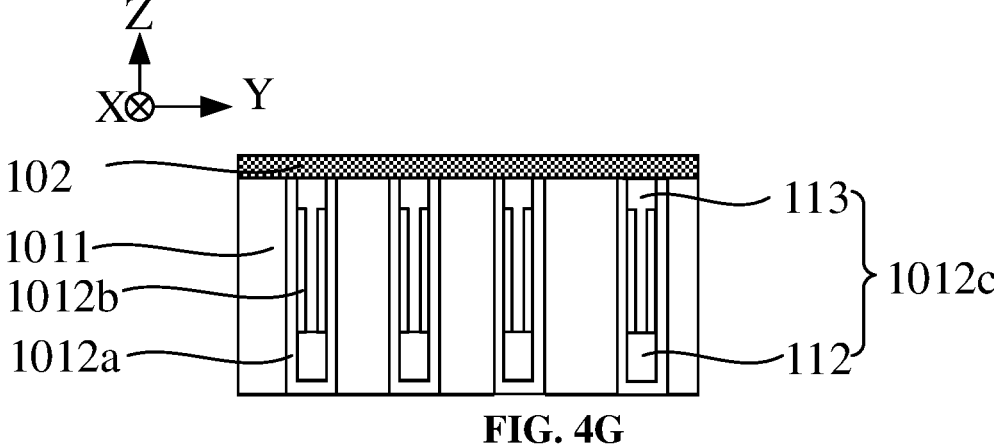
FIG. 4G illustrates a sixth schematic structural diagram of a process for forming a semiconductor structure provided by an embodiment of the disclosure.

Here, the surface of the initial substrate on which the bit line structure is formed and the surface of the initial substrate subjected to the thinning treatment are two opposite surfaces, and are not the same surface. Referring to FIG. 4F, the initial substrate is subjected to thinning treatment by chemical mechanical grinding, dry etching, wet etching or any combination thereof until the surface of the bottom of the gate-all-around structure as shown in FIG. 4G is exposed. Thus, the storage chip is formed, one surface of the storage chip is provided with the bit line structure 102, and the other surface of the storage chip exposes the gate dielectric layer 1012a of the gate-all-around structure.

In the embodiments of this disclosure, the thinning treatment is performed on the initial substrate until the surface of the bottom of the gate-all-around structure is exposed, which is beneficial to electrically connecting the gate-all-around structure to the subsequently formed capacitor structure.

In some embodiments, thinning treatment may be performed on the storage chip after the control chip and the storage chip are connected in the face-to-face bonding manner, until a surface of a bottom of the gate-all-around structure is exposed.

Figure 5A:
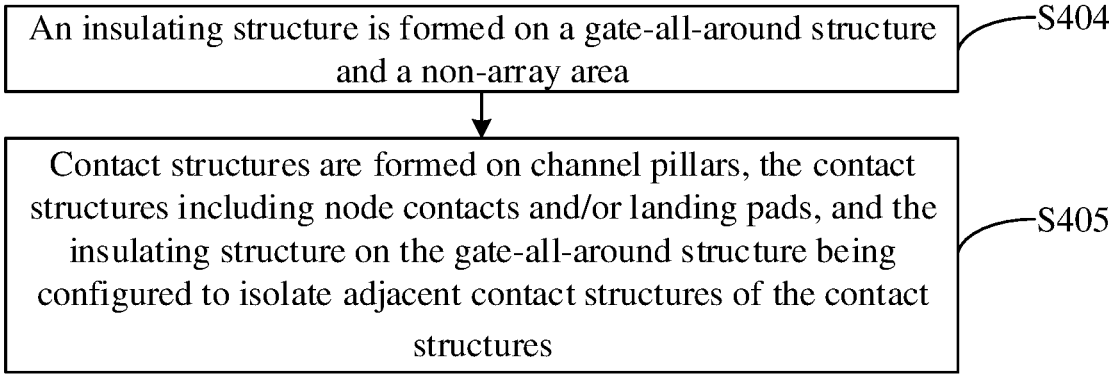
FIG. 5A illustrates an implementation flowchart of a method for forming another semiconductor structure provided by an embodiment of the disclosure.

In some embodiments, referring to FIG. 5A, the storage chip further includes a non-array area. After the control chip and the storage chip are connected in the face-to-face bonding manner, the method for forming the semiconductor structure further includes S404 and S405.

At S404, an insulating structure is formed on the gate-all-around structure and the non-array area.

At S405, contact structures are formed on the channel pillars, the contact structures including node contacts and/or landing pads, and the insulating structure on the gate-all-around structure being configured to isolate adjacent contact structures of the contact structures.

During implementation, an insulating material may be deposited on the gate-all-around structure and the non-array area first. After that, the insulating material is etched to form a gap. The gap may expose the channel pillar. Finally, the contact structure may be formed in the gap. The contact structures may include node contacts, or landing pads, and may include the node contacts and the landing pads at the same time.

Referring to FIG. 3B and FIG. 4G at the same time, the insulating structure 40 is formed on the gate-all-around structure 1012 and the non-array area 12. The contact structure including the node contact 50 and the landing pad 60 is formed on the channel pillar 1011.

Here, the capacitors of the capacitor structure are electrically connected to the transistors in the array area through the node contacts and/or landing pads.

In some embodiments, referring to FIG. 5B, S403 that "the capacitor structure is formed on the surface, away from the bonding surface, of the storage chip" may include S4031 to S4036.

At S4031, a stacking layer is formed on the surface, away from the bonding surface, of the storage chip, the stacking layer including: an initial first sacrificial layer, an initial first supporting layer, an initial second sacrificial layer, and an initial second supporting layer in sequence from bottom to top.

Here, the material used by each of the initial first supporting layer and the initial second supporting layer may include at least one of: silicon oxide, silicon nitride, nitrogen silicon carbide, and silicon oxynitride. The material used by an initial first sacrificial layer in the embodiments of the disclosure may be silicon oxide. The material used by each of the initial first supporting layer and the initial second supporting layer may be silicon nitride.

The initial first sacrificial layer, the initial first supporting layer, the initial second sacrificial layer, and the initial second supporting layer may be formed by any appropriate deposition process, such as a CVD process, a PVD process, an ALD process, a spin coating process, or a coating process.

Figure 5C:
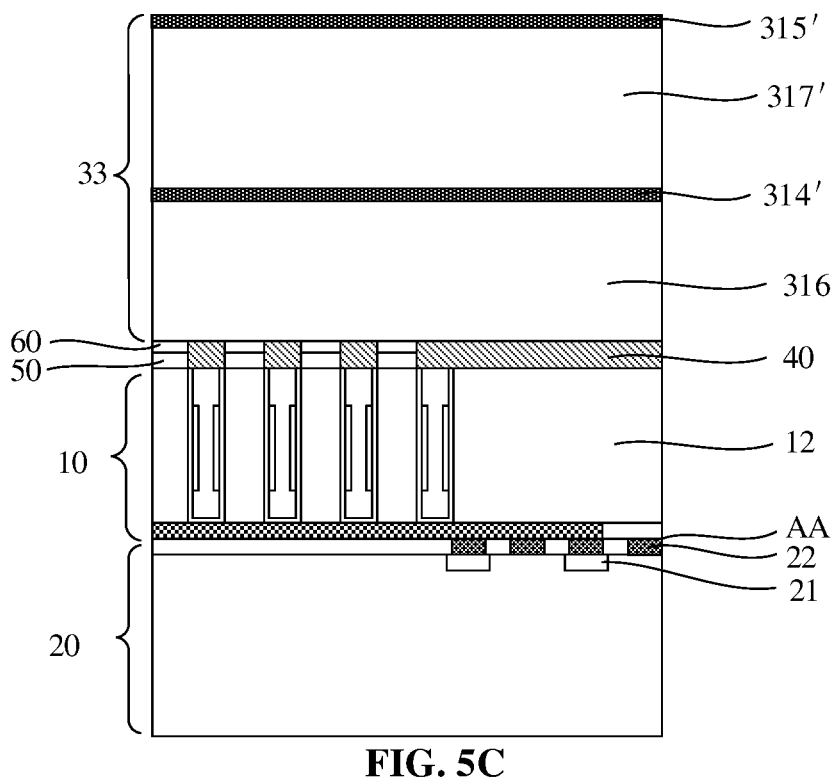
FIG. 5C illustrates a first schematic structural diagram of a process for forming a semiconductor structure provided by an embodiment of the disclosure.

Referring to FIG. 5C, a stacking layer 33 is formed on the surface, away from the bonding surface AA, of the storage chip 10. The stacking layer 33 includes: an initial first sacrificial layer 316', an initial first supporting layer 314', an initial second sacrificial layer 317', and an initial second supporting layer 315' in sequence from bottom to top.

At S4032, the stacking layer is patterned, so as to form capacitance holes on the surface, away from the bonding surface, of the storage chip.

Figure 5D:
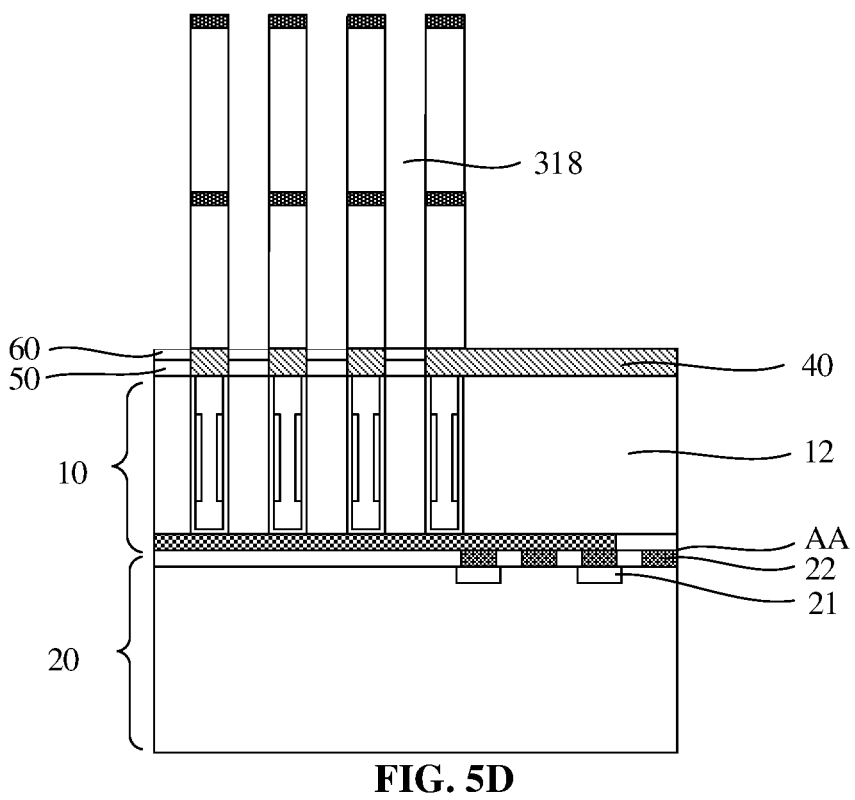
FIG. 5D illustrates a second schematic structural diagram of a process for forming a semiconductor structure provided by an embodiment of the disclosure.

When the stacking layer is patterned, part of the initial first sacrificial layer, part of the initial first supporting layer, part of the initial second sacrificial layer, and part of the second supporting layer need to be etched in the Y-axis direction. During implementation, the stacking layer 33 may be etched by dry etching (such as a plasma etching process, reactive ion etching process or an ion milling process), so as to form the capacitance holes 318 as shown in FIG. 5D. The gas used by the dry etching may be one of trifluoromethane ($CHF_3$), carbon tetrafluoride ($CF_4$), difluoromethane ($CH_2F_2$), hydrobromic acid (HBr), chlorine ($Cl_2$) or sulfur hexafluoride ($SF_6$) or combination thereof.

In some embodiments, referring to FIG. 5D, the stacking structure on the non-array area 12 will be etched when the capacitance holes are formed, so as to expose the surface of the insulating structure 40.

At S4033, a first electrode layer is formed on an inner wall of each of the capacitance holes.

Figure 5E:
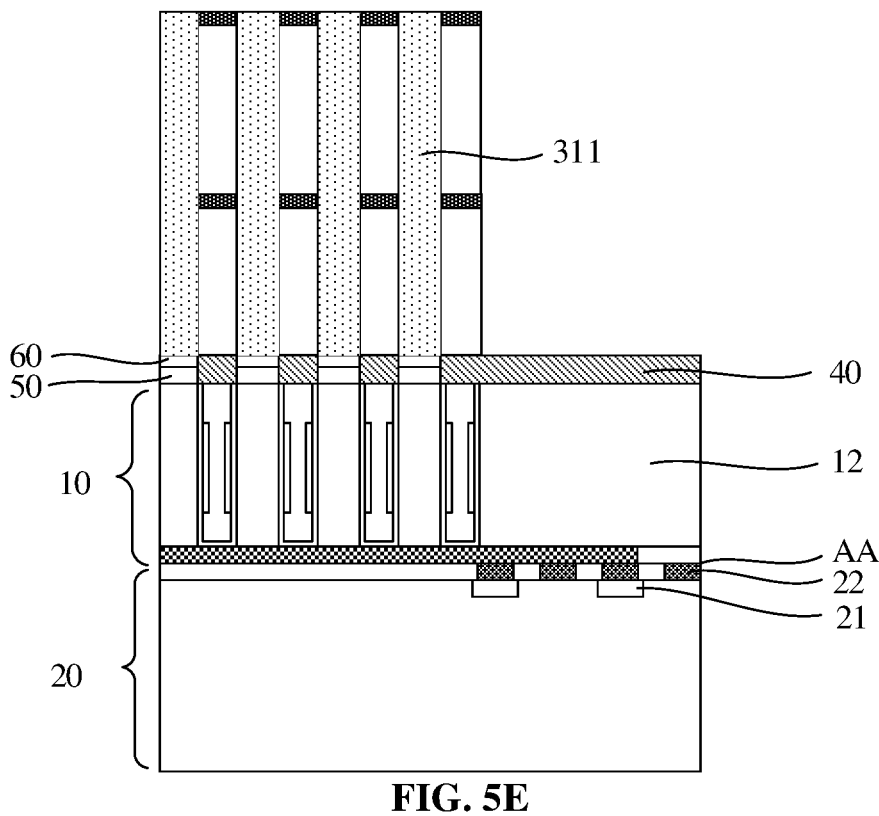
FIG. 5E illustrates a third schematic structural diagram of a process for forming a semiconductor structure provided by an embodiment of the disclosure.

Referring to FIG. 5e, a first electrode layer 311 is formed on an inner wall of each of the capacitance holes 318.

At S4034, the rest of the initial first supporting layer and the rest of the initial second supporting layer are patterned, so as to form openings among a plurality of adjacent capacitance holes of the capacitance holes.

Here, the function of forming the openings among a plurality of adjacent capacitance holes is to facilitate etching the initial first supporting layer and the initial second supporting layer below the openings subsequently, thereby facilitating subsequent formation of a dielectric layer and a second electrode layer on the surface of the first electrode layer.

Figure 5F:
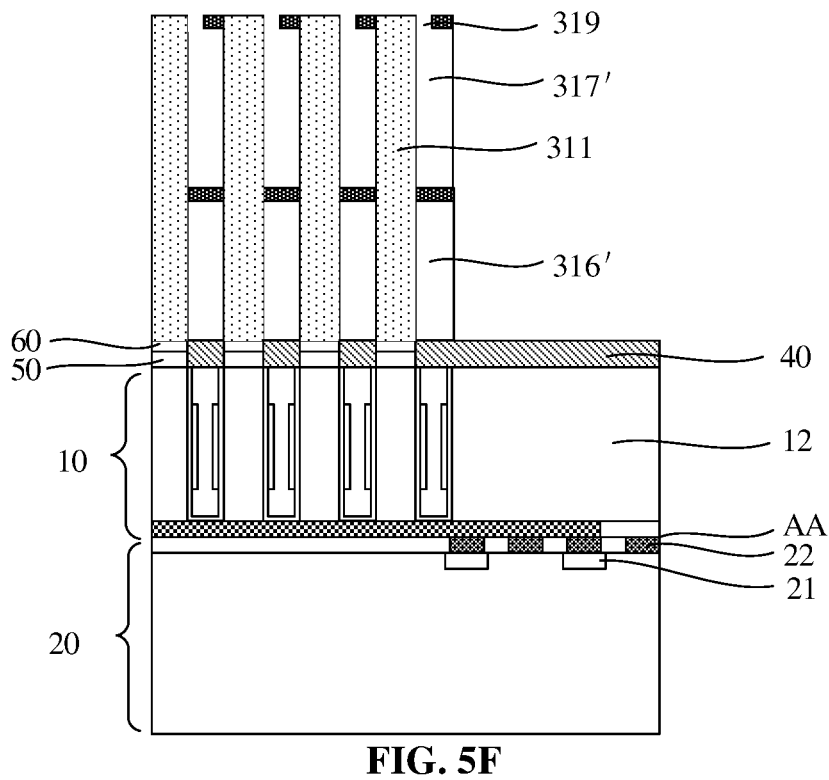
FIG. 5F illustrates a fourth schematic structural diagram of a process for forming a semiconductor structure provided by an embodiment of the disclosure.

Referring to FIG. 5F, the rest of the initial first supporting layer and the rest of the initial second supporting layer are patterned, so as to form openings 319 among a plurality of adjacent capacitance holes (or first electrode layers).

At S4035, the rest of the initial first sacrificial layer and the rest of the initial second sacrificial layer are etched through the openings.

Referring to FIG. 5F, the rest of the initial first sacrificial layer 316' and the rest of the initial second sacrificial layer 317' are etched through the openings 319, so as to remove the rest of the initial first sacrificial layer 316' and the rest of the initial second sacrificial layer 317'. The rest of the initial first sacrificial layer and the rest of the initial second sacrificial layer may be etched by dry etching or wet etching. A wet etching solution may be a mixed solution including Diluted Hydrofluoric Acid (DHF) and aqueous ammonia ($NH_4OH$), or may be a mixed solution including the DHF and Tetramethylammonium Hydroxide (TMAH).

At S4036, a dielectric layer and a second electrode layer are formed on a surface of the first electrode layer in sequence, so as to form the capacitor structure.

During implementation, the dielectric layer and the second electrode layer may be formed by any appropriate deposition process, such as a CVD process, a PVD process, an ALD process, a spin coating process, or a coating process. Referring to FIG. 3B, a dielectric layer 313 and a second electrode layer 312 are formed on a surface of the first electrode layer 311 in sequence, so as to form the capacitor structure 30.

In some embodiments, referring to FIG. 6A, the method for forming the semiconductor structure further includes S406 and S407.

At S406, a filling layer and a first metal layer are formed on a surface, away from the bonding surface, of the non-array area, on an upper surface of capacitor structure, and between the capacitors in sequence. The filling layer is electrically connected to the second electrode layer.

During implementation, the filling layer and the first metal layer may be formed by any appropriate deposition process, such as a CVD process, a PVD process, an ALD process, a spin coating process, or a coating process. Referring to FIG. 3C, a filling layer 32 and a first metal layer 70 are formed on a surface, away from the bonding surface, of the non-array area 12, on an upper surface of capacitor structure 30, and between the capacitors 31 in sequence. The filling layer 32 is electrically connected to the second electrode layer 312.

At S407, a first conductive pillar connecting the first metal layer and a contact pad is formed in the non-array area to electrically connect the capacitors with the contact pad, herein the contact pad is located in the peripheral area and is configured to electrically connect the storage chip.

Referring to FIG. 6B, a first through hole 80a is formed in the non-array area 12, and a conductive material is filled in the first through hole 80a, so as to form a first conductive pillar 80 as shown in FIG. 3C.

Figure 6C:
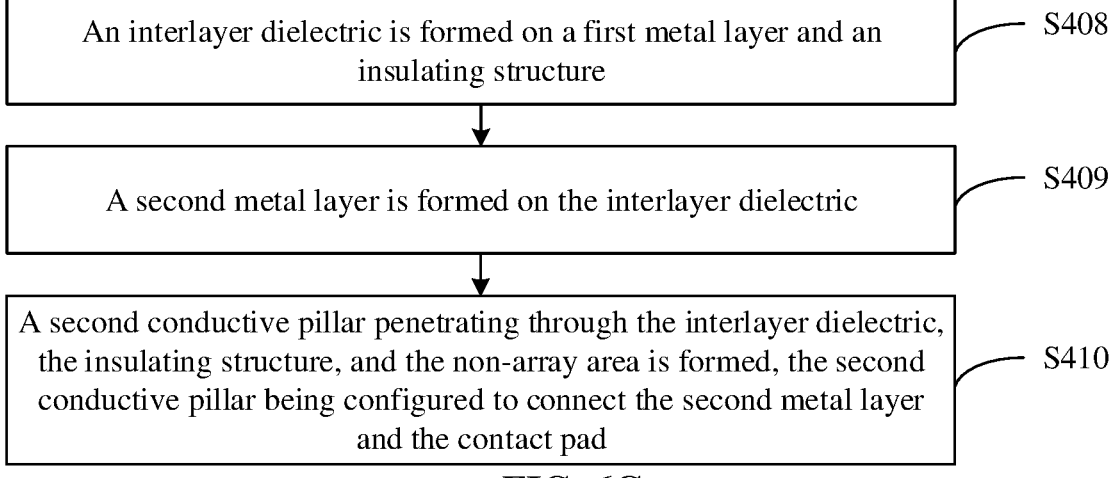
FIG. 6C illustrates an implementation flowchart of a method for forming another semiconductor structure provided by an embodiment of the disclosure.

In some embodiments, referring to FIG. 6C, the method for forming the semiconductor structure further includes S408 to S410.

At S408, an interlayer dielectric is formed on the first metal layer and insulating structure.

Referring to FIG. 3D, the interlayer dielectric 90 is located on the first metal layer 70 and the insulating structure 40.

At S409, a second metal layer is formed on the interlayer dielectric.

During implementation, the interlayer dielectric and the second metal layer may be formed by any appropriate deposition process, such as a CVD process, a PVD process, an ALD process, a spin coating process, or a coating process. Referring to FIG. 3D, a second metal layer 100 is deposited on the interlayer dielectric 90.

At S410, a second conductive pillar penetrating through the interlayer dielectric, the insulating structure, and the non-array area is formed, the second conductive pillar being configured to connect the second metal layer and the contact pad.

Referring to FIG. 3D, a second conductive pillar 110 penetrating through the interlayer dielectric 90, the insulating structure 40, and the non-array area 12 is formed. Here, the steps for forming the second conductive pillar are similar to those for forming the first conductive pillar, which will not be elaborated herein.

The embodiments of the disclosure further provide a method for forming a semiconductor structure, which includes S501 to S503.

At S501, a control chip including a peripheral area and a storage chip including an array area are provided.

At S502, a capacitor structure is formed on the storage chip. The capacitor structure includes capacitors electrically connected to corresponding transistors in the array area.

At S503, the storage chip and the control chip are connected in a face-to-face bonding manner. The capacitor structure is arranged away from a bonding surface.

The difference between the method for forming the semiconductor structure provided by the embodiments of the disclosure and the abovementioned forming method is that: the capacitor structure is formed on the storage chip first, and then the storage chip and the control chip are connected in a face-to-face bonding manner. Thus, the influence on the peripheral circuit of the control chip due to the high temperature of formation of the capacitor structure can be reduced.

In the embodiments of the disclosure, a semiconductor structure includes a storage chip and a control chip connected in a face-to-face bonding manner, and a capacitor structure located on a surface, away from a bonding surface, of the storage chip. On the one hand, the storage chip and the control chip are connected in a face-to-face bonding manner, that is, the storage chip and the control chip are stacked together by facing a front surface of the storage chip to a front surface of the control chip. Compared with a plane semiconductor structure, the dimension of a semiconductor structure can be reduced, so as to realize better miniaturization. Compared with other bonding modes, the control chip and the storage chip are connected in a face-to-face bonding manner, so that the number and the complexity of conductive routes can be minimized, the formation of the control chip and the storage chip becomes easier while maintaining the expected yield. In the other aspect, the storage chip and the control chip forming the semiconductor structure in the embodiments of the disclosure may be produced at the same time, and then are bonded. Thus, the production time can be shortened, so as to improve the production efficiency.

In several embodiments provided by the disclosure, it is to be understood that the disclosed structure and method may be implemented in a non-target mode. The above described structure embodiments are only schematic. For example, the division of the units is only logical function division. In actual implementation, there may be other division modes, for example, a plurality of units or components may be combined, or may be integrated into another system, or some features may be ignored or not implemented. In addition, the components shown or discussed are coupled to each other, or directly coupled.

The abovementioned units described as separate components may be, or may not be physically separated, and the components displayed as units may be, or may not be physical units, that is, they may be located in one place or distributed over a plurality of network units. Some or all of them may be selected according to actual needs to achieve the purpose of the embodiment. The characteristics disclosed in several method or device embodiments provided in the disclosure may be freely combined without conflicts to obtain new method embodiments or device embodiments.

The abovementioned descriptions are only some implementation modes of the disclosure, but the scope of protection of the embodiments of the disclosure are not limited thereto. Any variation or replacement readily conceived by a person skilled in the art within the technical scope disclosed in the disclosure shall fall within the scope of protection of the disclosure. Therefore, the scope of protection of the embodiments of the disclosure shall be subject to the scope of protection of the claims.

What is claimed is:

1. A semiconductor structure, comprising: a storage chip, a control chip, and a capacitor structure, wherein the storage chip comprises an array area, and the control chip comprises a peripheral area;

the control chip and the storage chip are connected in a face-to-face bonding manner;

the capacitor structure is located on a surface, away from a bonding surface, of the storage chip; and the capacitor structure comprises capacitors electrically connected to corresponding transistors in the array area;

wherein the array area further comprises: a bit line structure, located on a surface, close to the bonding surface, of the storage chip; and the bit line structure is located between and electrically connected to the control chip and the transistors;

wherein each capacitor comprises a first electrode layer, a second electrode layer, and a dielectric layer located between the first electrode layer and the second electrode layer; and each first electrode layer is electrically connected to a corresponding one of the transistors in the storage chip, the second electrode layer is electrically connected to the control chip.

2. The structure as claimed in claim 1, wherein each of the transistors comprises: a channel pillar and a gate-all-around structure surrounding the channel pillar, wherein the channel pillars extend in a first direction and are arranged in a second direction; and each of the capacitors is electrically connected with an end of the channel pillar.

3. The structure as claimed in claim 2, wherein the gate-all-around structure comprises: a gate dielectric layer, a gate metal layer, and an insulating layer;

the gate dielectric layer being located on an outer wall of the channel pillar;

the gate metal layer being in contact with a side wall of the gate dielectric layer; and the insulating layer being located in a groove between adjacent channel pillars of the channel pillars, and fully filling the groove.

4. The structure as claimed in claim 3, wherein the bit line structure is electrically connected to the control chip and the channel pillars.

5. The structure as claimed in claim 2, wherein the peripheral area comprises a peripheral circuit and a contact pad connected to the peripheral circuit;

the peripheral circuit is configured to control turn-on or turn-off of the transistors, so as to perform at least one of storing data into the corresponding capacitors, or reading data from the corresponding capacitors; and the contact pad is configured to electrically connect the storage chip.

6. The structure as claimed in claim 5, wherein the storage chip further comprises a non-array area; and the structure further comprises:

an insulating structure located on the gate-all-around structures and the non-array area; and at least one of node contacts or landing pads located on the channel pillars, and the capacitors of the capacitor structure being electrically connected to the transistors in the array area through the at least one of the node contacts or the landing pads.

7. The structure as claimed in claim 1, wherein there is a first supporting layer and a second supporting layer arranged in parallel between the capacitors;

the first supporting layer being arranged on a periphery of a middle part of the capacitor;

the second supporting layer being arranged on a periphery of a top part of the capacitor; and the first supporting layer and the second supporting layer being configured to support the capacitor together.

8. The structure as claimed in claim 1, further comprising: a filling layer, a first metal layer, and a first conductive pillar, wherein the filling layer is located on a surface, away from the bonding surface, of the non-array area, on an upper surface of the capacitor structure, and between the capacitors, and the filling layer is electrically connected to the second electrode layer;

the first metal layer is located on the filling layer; and the first conductive pillar is located in the non-array area, and two ends of the first conductive pillar are respectively connected to the first metal layer and the contact pad, and are configured to electrically connect the capacitors and the contact pad.

9. The structure as claimed in claim 8, further comprising:

an interlayer dielectric located on the first metal layer and the insulating structure;

a second metal layer located on the interlayer dielectric; and a second conductive pillar connecting the second metal layer and the contact pad, wherein the second conductive pillar penetrates through the interlayer dielectric, the insulating structure, and the non-array area, and is configured to electrically connect the second metal layer and the contact pad.

10. A method for forming a semiconductor structure, comprising:

providing a control chip comprising a peripheral area and a storage chip comprising an array area;

connecting the control chip and the storage chip in a face-to-face bonding manner; and forming a capacitor structure on a surface, away from a bonding surface, of the storage chip, wherein the capacitor structure comprises capacitors electrically connected to corresponding transistors in the array area;

wherein the array area further comprises: a bit line structure, located on a surface, close to the bonding surface, of the storage chip; and the bit line structure is located between and electrically connected to the control chip and the transistors;

wherein each capacitor comprises a first electrode layer, a second electrode layer, and a dielectric layer located between the first electrode layer and the second electrode layer; and each first electrode layer is electrically connected to a corresponding one of the transistors in the storage chip, the second electrode layer is electrically connected to the control chip.

11. The method as claimed in claim 10, wherein each of the transistors comprises: a channel pillar and a gate-all-around structure surrounding the channel pillar; and wherein the method comprises a method for forming the storage chip comprising:

providing an initial substrate, comprising the channel pillars and grooves extending in a first direction and arranged in a second direction; and forming the gate-all-around structure surrounding the channel pillar.

12. The method as claimed in claim 11, wherein the gate-all-around structure comprises: a gate dielectric layer, a first sub-insulating layer, a gate metal layer, and a second sub-insulating layer; forming the gate-all-around structure surrounding the channel pillar comprises:

forming the gate dielectric layer on an outer wall of the channel pillar;

forming the first sub-insulating layer at a bottom of a groove in which the gate dielectric layer is formed;

forming on the channel pillar the gate metal layer surrounding the channel pillar; and forming in the groove the second sub-insulating layer which is flush with a surface of the initial substrate.

13. The method as claimed in claim 11, wherein the bit line structure electrically connected to the channel pillars and the control chip; the method for forming the storage chip further comprises:

forming the bit line structure on a surface of the initial substrate where the gate-all-around structure is formed.

14. The method as claimed in claim 13, wherein the method for forming the storage chip further comprises:

performing thinning treatment on the initial substrate until a surface of a bottom of the gate-all-around structure is exposed.

15. The method as claimed in claim 13, after connecting the control chip and the storage chip in the face-to-face bonding manner, further comprising: performing thinning treatment on the storage chip until a surface of a bottom of the gate-all-around structure is exposed.

16. The method as claimed in claim 14, wherein the storage chip further comprises a non-array area; the method, after connecting the control chip and the storage chip in the bonding manner, further comprises:

forming an insulating structure on the gate-all-around structure and the non-array area;

forming contact structures on the channel pillars, the contact structures comprising at least one of node contacts or landing pads, and the insulating structure on the gate-all-around structure being configured to isolate adjacent contact structures of the contact structures, wherein the capacitors of the capacitor structure are electrically connected to the transistors in the array area through the contact structures.

17. The method as claimed in claim 16, wherein forming the capacitor structure on the surface, away from the bonding surface, of the storage chip comprises:

forming a stacking layer on the surface, away from the bonding surface, of the storage chip, the stacking layer comprising an initial first sacrificial layer, an initial first supporting layer, an initial second sacrificial layer, and an initial second supporting layer in sequence from bottom to top;

patterning the stacking layer, so as to form capacitance holes on the surface, away from the bonding surface, of the storage chip;

forming the first electrode layer on an inner wall of each of the capacitance holes;

patterning the rest of the initial first supporting layer and the rest of the initial second supporting layer, so as to form openings among a plurality of adjacent capacitance holes of the capacitance holes;

etching the rest of the initial first sacrificial layer and the rest of the initial second sacrificial layer through the openings; and forming the dielectric layer and the second electrode layer on a surface of the first electrode layer in sequence, so as to form the capacitor structure.

18. The method as claimed in claim 17, further comprising:

forming a filling layer and a first metal layer on a surface, away from the bonding surface, of the non-array area, on an upper surface of the capacitor structure, and between the capacitors in sequence, wherein the filling layer is electrically connected to the second electrode layer; and forming a first conductive pillar connecting the first metal layer and a contact pad in the non-array area to electrically connect the capacitors with the contact pad, wherein the contact pad is located in the peripheral area and is configured to electrically connect the storage chip.

19. The method as claimed in claim 18, further comprising:

forming an interlayer dielectric on the first metal layer and the insulating structure;

forming a second metal layer on the interlayer dielectric; and forming a second conductive pillar penetrating through the interlayer dielectric, the insulating structure, and the non-array area, the second conductive pillar being configured to connect the second metal layer and the contact pad.

* * * * *